US008947955B2

(12) United States Patent
Byun et al.

(10) Patent No.: US 8,947,955 B2
(45) Date of Patent: Feb. 3, 2015

(54) SEMICONDUCTOR MEMORY, MEMORY SYSTEM, AND OPERATION METHOD THEREOF

(71) Applicant: SK hynix Inc., Gyeonggi-do (KR)

(72) Inventors: Hee-Jin Byun, Gyeonggi-do (KR); Ki-Chang Kwean, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 47 days.

(21) Appl. No.: 13/844,924

(22) Filed: Mar. 16, 2013

(65) Prior Publication Data

US 2014/0185396 A1 Jul. 3, 2014

(30) Foreign Application Priority Data

Dec. 28, 2012 (KR) ........................ 10-2012-0157422

(51) Int. Cl.

*G11C 7/00* (2006.01)
*G11C 7/10* (2006.01)
*G11C 29/02* (2006.01)
*G11C 29/04* (2006.01)
*G11C 29/44* (2006.01)

(52) U.S. Cl.

CPC ............ *G11C 7/1045* (2013.01); *G11C 29/022* (2013.01); *G11C 29/023* (2013.01); *G11C 29/028* (2013.01); *G11C 2029/0409* (2013.01); *G11C 2029/4402* (2013.01)

USPC ........................ 365/193; 365/191; 365/230.06

(58) Field of Classification Search

CPC ............ G11C 7/22; G11C 7/227; G11C 8/04; G11C 8/18; G11C 2029/0407; G11C 2029/50

USPC .......... 365/193, 191, 201, 230.06, 226, 225.7

See application file for complete search history.

(56) References Cited

U.S. PATENT DOCUMENTS

| | | | | |
|---|---|---|---|---|
| 7,529,112 | B2 * | 5/2009 | Dreps et al. | 365/51 |
| 8,139,430 | B2 * | 3/2012 | Buchmann et al. | 365/201 |
| 2003/0126356 | A1 * | 7/2003 | Gustavson et al. | 711/105 |
| 2012/0047320 | A1 | 2/2012 | Yoo et al. | |
| 2013/0083611 | A1 * | 4/2013 | Ware et al. | 365/191 |

FOREIGN PATENT DOCUMENTS

| | | |
|---|---|---|
| KR | 100564635 | 3/2006 |

* cited by examiner

*Primary Examiner* — Gene Auduong

(74) *Attorney, Agent, or Firm* — IP&T Group LLP

(57) ABSTRACT

A memory system includes a semiconductor memory including a storage unit configured to store parameter information in response to a test mode signal and to output the stored parameter information in response to a parameter request signal, and a memory controller configured to provide the parameter request signal to the semiconductor memory and receive the parameter information from the semiconductor memory device.

18 Claims, 3 Drawing Sheets

SEMICONDUCTOR MEMORY, MEMORY SYSTEM, AND OPERATION METHOD THEREOF

CROSS-REFERENCE TO RELATED APPLICATION

The present application claims priority of Korean Patent Application No. 10-2012-0157422 filed on Dec. 28, 2012, which is incorporated herein by reference in its entirety.

BACKGROUND

1. Field

Exemplary embodiments of the present invention relate to semiconductor design technology, and more particularly, to a semiconductor memory and a memory system for tuning a clock-based parameter.

2. Description of the Related Art

AC parameters relating to a semiconductor memory may be varied by controlling the internal/external environments of the semiconductor memory. Lots of testing and tuning works are required for a memory controller to check and optimize the AC parameters.

For example, an AC parameter 'tDQSCK' indicates a timing difference between a system clock used in a semiconductor memory and a data strobe signal output from the semiconductor memory when a read operation is performed and indicates the degree of an alignment of the data strobe signal and the system clock. The timing of the data strobe signal is determined based on a delay locked loop clock generated from an internal clock generator that is called a delay locked loop (hereinafter referred to as a 'DLL'). Thus, the timing of the data strobe signal has a different value depending on the environments of a DLL block and the related circuits. The environments may include a process, voltage, and temperature (PVT).

Accordingly, semiconductor memories mounted on a module have a difference in the parameter 'tDCSCK'.

When a dynamic random access memory (DRAM) is used as a component in a specific memory system, pieces of information are exchanged on the assumption that a data signal and a data strobe signal are reached within a given specification. Accordingly, when receiving the data signal and the data strobe signal from the DRAM, a memory controller has to secure a margin so that a normal operation is performed irrespective of whether the data signal and the data strobe signal are located at which place of a window.

As described above, since the parameters may be changed by the environments, it is required to check the AC parameters, especially clock-based parameters, to have proper values and to perform lots of tuning works, called training. However, the training requires many times of information exchanges to be taken.

SUMMARY

Exemplary embodiments of the present invention are directed to provide a semiconductor memory and a memory system controller in which the interface information may be optimized without an additional training works.

In accordance with an embodiment of the present invention, a memory system may include a semiconductor memory including a storage unit configured to store clock-based parameter information in response to a test mode signal and to output the stored clock-based parameter information in response to a parameter request signal, and a memory controller configured to provide the parameter request signal to the semiconductor memory and receive the clock-based parameter information from the semiconductor memory device.

In accordance with another embodiment of the present invention, a operation method of a memory controller may include requesting clock-based parameter information to a semiconductor memory, wherein the clock-based parameter information is stored in a test operation for the semiconductor memory, receiving the clock-based parameter information output from the semiconductor memory, and adjusting an interface value for the semiconductor memory based on the clock-based parameter information.

In accordance with yet another embodiment of the present invention, a semiconductor memory may include a delay locked loop configured to generate a data strobe signal based on a system clock, and a storage unit configured to store a parameter information in a test operation and to output the stored parameter in a normal operation. The parameter information corresponds to a skew between the data strobe signal and the system clock.

DETAILED DESCRIPTION

Figure 1:
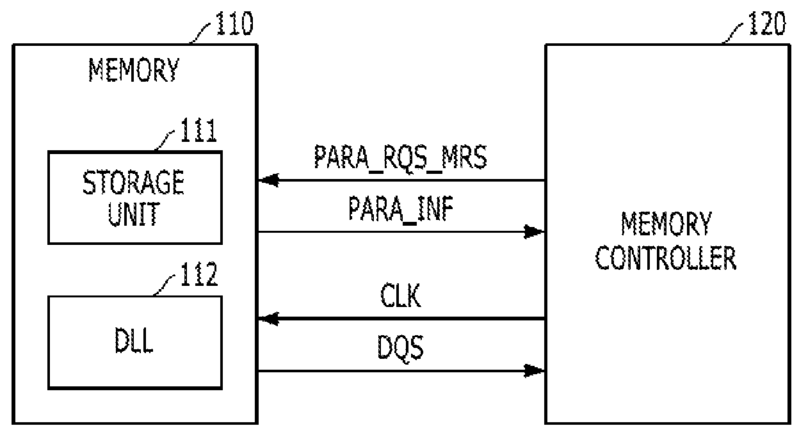
FIG. 1 is a block diagram illustrating a memory system in accordance with an embodiment of the present invention.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a memory system in accordance with an embodiment of the present invention.

Referring to FIG. 1, the memory system includes a semiconductor memory 110 and a memory controller 120.

The semiconductor memory 110 includes a storage unit 111 configured to store a clock-based parameter information PARA_INF that corresponds to a skew between the data strobe signal and the system clock, and to output the stored clock-based parameter information PARA_INF in response to a parameter request signal PARA_RQS_MRS. The memory controller 120 is configured to provide the parameter request signal PARA_RQS_MRS to the semiconductor memory 110 and to receive the clock-based parameter information PARA_INF from the semiconductor memory 110.

The clock-based parameter information PARA_INF may include information corresponding to a parameter tDQSCK of the semiconductor memory 110.

The clock-based parameter information PARA_INF may be transmitted to the memory controller 120 as a binary number form or period information form with a conversion, which is agreed between the semiconductor memory 110 and the memory controller 120. Here, the period information defines what information is included in each period in a table. For example, information on a period, such as a first period of 0~50 ps is converted into '001' or a second period of 50~100 ps is converted into '010', may be defined in the period information. When the period information is received as described above, the memory controller 120 may obtain desired information immediately.

Meanwhile, the semiconductor memory 110 may further include a DLL 112 configured to generate a data strobe signal DQS based on a system clock CLK supplied by the memory controller 120. The parameter tDQSCK may be varied according to the environments of the DLL 112. When the clock-based parameter information PARA_INF is transmitted to the memory controller 120, the memory controller 120 may adjust an interface value for the semiconductor memory 110 based on the clock-based parameter information PARA_INF.

Figure 2:
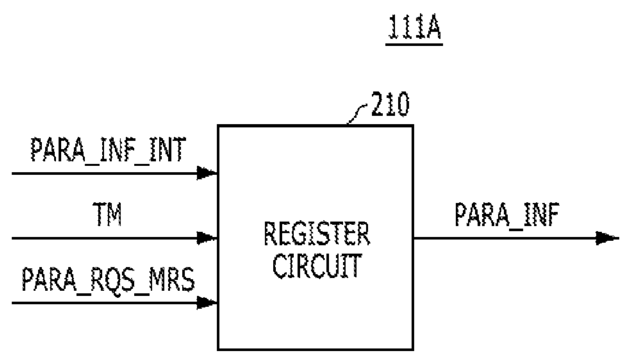
FIG. 2 is a detailed block diagram illustrating an embodiment of a storage unit shown in FIG. 1.

FIG. 2 is a detailed block diagram illustrating an embodiment of the storage unit 111 shown in FIG. 1.

Referring to FIG. 2, the storage unit 111A may be implemented by using a register circuit 210. The register circuit 210 is configured to store internal clock-based parameter information PARA_INF_INT in response to a test mode signal TM, and to output the stored information PARA_INF_INT as the clock-based parameter information PARA_INF to the memory controller 120 in response to the parameter request signal PARA_RQS_MRS. Here, the internal clock-based parameter information PARA_INF_INT may be generated as the result of a test operation and may be stored when the test mode signal TM is activated in a specific test mode. Further, the parameter request signal PARA_RQS_MRS may be activated when a power-up sequence is performed in a normal operation of the semiconductor memory 110. Also, the parameter request signal PARA_RQS_MRS may be transferred from the memory controller 120 as a specific MRS command in the power-up sequence.

Figure 3:
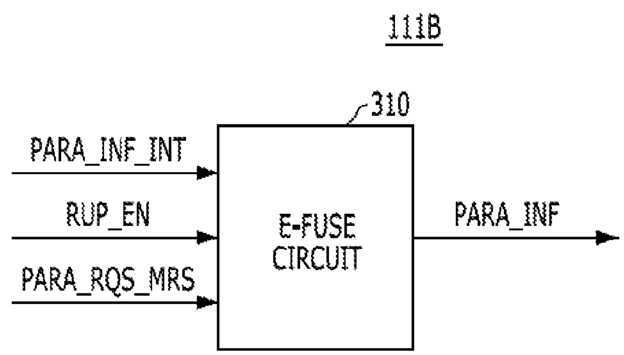
FIG. 3 is a detailed block diagram illustrating another embodiment of a storage unit shown in FIG. 1.

FIG. 3 is a detailed block diagram illustrating another embodiment of the storage unit 111 shown in FIG. 1.

Referring to FIG. 3, the storage unit 111B may be implemented by using e-fuse circuit 310. The e-fuse circuit 310 is configured to program therein internal clock-based parameter information PARA_INF_INT in response to a rupture enable signal RUP_EN, and to output the programmed information PARA_INF_INT as to the memory controller 120 in response to the parameter request signal PARA_RQS_MRS. The e-fuse circuit may be ruptured (programmed) based on the information PARA_INF_INT. The rupture enable signal RUP_EN is activated in a specific test mode. Further, the parameter request signal PARA_RQS_MRS may be activated when a power-up sequence is performed in a normal operation of the semiconductor memory 110. Also, the parameter request signal PARA_RQS_MRS may be transferred from the memory controller 120 as a specific MRS command in the power-up sequence.

Figure 4:
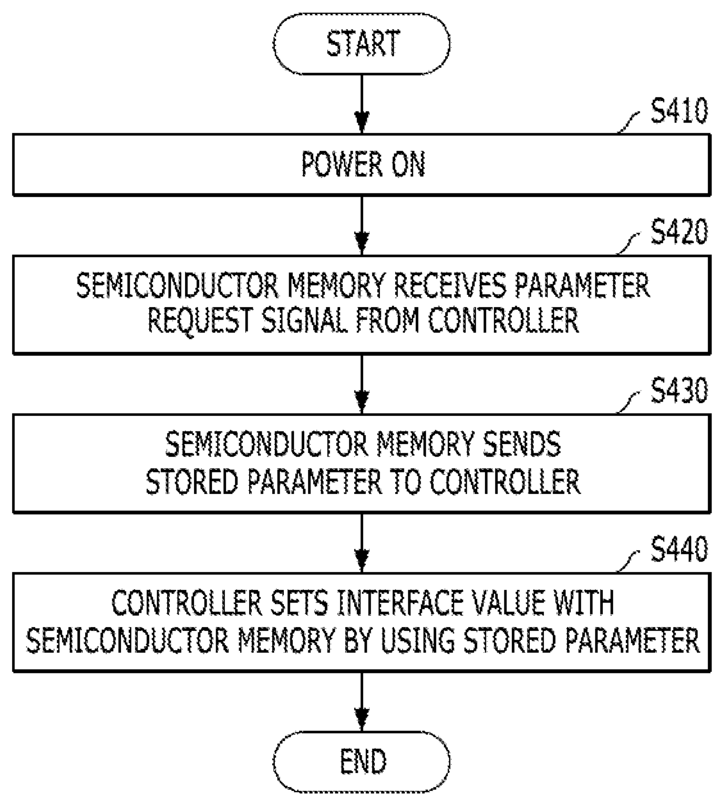
FIG. 4 is a flowchart illustrating an operation method of a memory system in accordance with an embodiment of the present invention.

FIG. 4 is a flowchart illustrating an operation method of the memory system in accordance with the embodiment of the present invention.

Referring to FIGS. 1 and 4, in the operation method includes steps S410 to S430. It is assumed that the semiconductor memory 110 has the clock-based parameter information PARA_INF stored therein through a specific test mode.

First, the semiconductor memory 110 is powered on by the memory controller 120, and the semiconductor memory 110 starts a given power-up sequence at step S410.

At step S420, the memory controller 120 transmits the parameter request signal PARA_RQS_MRS to the semiconductor memory 110. At step S420, the semiconductor memory 110 output the clock-based parameter information PARA_INF, and the memory controller 120 receives the clock-based parameter information PARA_INF sent from the semiconductor memory 110. And then, the memory controller 120 sets an interface value by using the received clock-based parameter information PARA_INF at step S440.

As described above, in accordance with the embodiment of the present invention, a clock-based parameter information may be stored in the semiconductor memory, and the parameter information may be transmitted to the memory controller according to the request of the memory controller. Accordingly, a tuning task may be easily performed based on a provided value even without an additional training works or a plurality of tests, and the components in the memory system may be used in the most optimized state.

Figure 5:
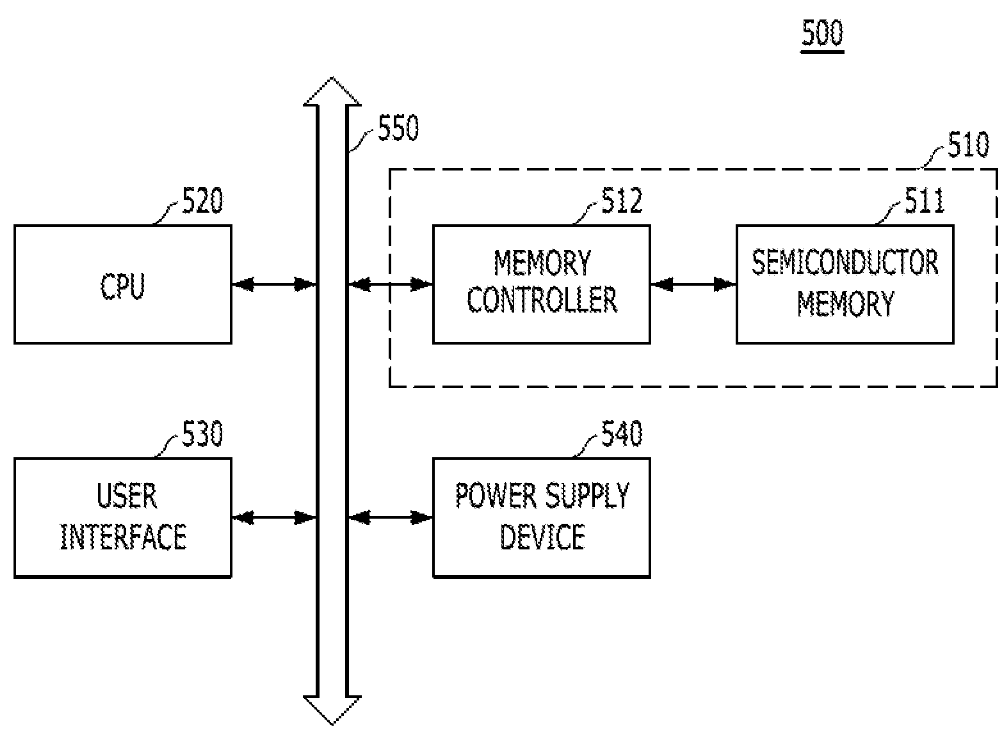
FIG. 5 is a block diagram illustrating an information processing system including a memory system in accordance with an embodiment of the present invention.

FIG. 5 is a block diagram illustrating an information processing system including the memory system in accordance with the embodiment of the present invention.

Referring to FIG. 5, the information processing system 500 may include a memory system 510, a central processing unit (CPU) 520, a user interface 530, and a power supply device 540, all of which may communicate data through a bus 550.

The memory system 510 may include at least a semiconductor memory 511, such as DRAM, and a memory controller 512. The memory system 510 may store data processed by the CPU 520 and external data received via the user interface 530. Further, the memory system 510 may perform the operation in accordance with the embodiment of the present invention.

In particular, the memory system 510 may store a clock-based parameter information and may transmit the stored clock-based parameter information to the memory controller 512 according to the request of the memory controller 512.

The information processing system 500 may be included in all electronic devices for storing data and may be supplied to a memory card, a solid state disk (SSD), and various types of mobile devices, such as smart phones.

In accordance with the embodiment of the invention, a clock-based parameter information may be stored in the semiconductor memory and the parameter information may be transmitted to the memory controller according to the request of the controller. Accordingly, there are advantages in that a tuning task may be easily performed based on a provided value even without an additional training works or a plurality of tests, and the components in the memory system may be used in the most optimized state.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined in the following claims.

What is claimed is:

1. A memory system, comprising:

a semiconductor memory including a storage unit configured to store a parameter information in response to a test mode signal and to output the stored parameter information in response to a parameter request signal; and a memory controller configured to provide the parameter request signal to the semiconductor memory and receive the parameter information from the semiconductor memory device, wherein the parameter information corresponds to a skew between the data strobe signal and the system clock.

2. The memory system of claim 1, wherein the semiconductor memory further includes a delay locked loop configured to generate a data strobe signal based on a system clock.

3. The semiconductor memory of claim 1, wherein the parameter information is generated in response to a request signal form the memory controller and is output through a power-up sequence in the normal operation.

4. The memory system of claim 1, wherein the storage unit comprises a register configured to store the parameter information in test mode.

5. The memory system of claim 1, wherein the storage unit comprises a register circuit or a fuse circuit.

6. The memory system of claim 1, wherein the parameter information is output as a binary number form or a period information form.

7. The memory system of claim 1, wherein the parameter information is a clock-based signal.

8. A semiconductor memory, comprising:

a delay locked loop configured to generate a data strobe signal based on a system clock; and a storage unit configured to store a parameter information in a test operation and to output the stored parameter information in a normal operation, wherein the parameter information corresponds to a skew between the data strobe signal and the system clock.

9. The semiconductor memory of claim 8, wherein the storage unit outputs the stored parameter information in response to a parameter request signal received from a memory controller.

10. The semiconductor memory of claim 8, wherein the stored parameter information is output through a power-up sequence in the normal operation.

11. The semiconductor memory of claim 9, wherein the stored parameter information is output as a binary number form or a period information form.

12. The semiconductor memory of claim 8, wherein the storage unit comprises a register circuit or a fuse circuit.

13. An operation method of a memory controller, the method comprising:

requesting a parameter information to a semiconductor memory, wherein the parameter information is stored in a test operation for the semiconductor memory;

receiving the parameter information output from the semiconductor memory; and setting a parameter value for the semiconductor memory based on the parameter information, wherein the parameter information corresponds to a skew between the data strobe signal and the system clock.

14. The operation method of claim 13, wherein the parameter value is an interface value.

15. The operation method of claim 13, wherein the semiconductor memory configured to generate and output a data strobe signal based on a system clock.

16. The operation method of claim 13, wherein the parameter information is output in a power-up sequence of the semiconductor memory.

17. The operation method of claim 13, wherein, in the receiving of the parameter information, the parameter information is output as a binary number form or a period information form.

18. The operation method of claim 13, wherein the parameter information is a clock-based signal.

* * * * *